(12) United States Patent
Chen et al.

(10) Patent No.: US 11,506,849 B2
(45) Date of Patent: Nov. 22, 2022

(54) OPTICAL TRANSCEIVER AND MANUFACTURING METHOD THEREOF

(71) Applicant: Delta Electronics, Inc., Taoyuan (TW)

(72) Inventors: Kuang-Yao Chen, Taoyuan (TW); Kao-Chi Chen, Taoyuan (TW); Wei-Chan Hsu, Taoyuan (TW); Gow-Zin Yiu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/349,398

(22) Filed: Jun. 16, 2021

(65) Prior Publication Data
US 2022/0252801 A1    Aug. 11, 2022

(30) Foreign Application Priority Data
Feb. 5, 2021 (CN) .......................... 202120334957.5

(51) Int. Cl.
*H04B 10/00* (2013.01)
*G02B 6/42* (2006.01)
*H05K 3/24* (2006.01)
*H04B 10/40* (2013.01)

(52) U.S. Cl.
CPC ........... *G02B 6/4272* (2013.01); *G02B 6/428* (2013.01); *H04B 10/40* (2013.01); *H05K 3/242* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,630,172 A * | 12/1986 | Stenerson | ......... | H01L 23/49827 257/E23.101 |
| 5,198,693 A * | 3/1993 | Imken | ................. | H01L 23/4006 257/679 |
| 5,459,639 A * | 10/1995 | Izumi | .................... | H01L 23/427 257/713 |
| 6,219,238 B1 * | 4/2001 | Andros | ............... | H01L 23/4093 248/510 |
| 6,847,111 B2 * | 1/2005 | Yang | ................... | H01L 23/4334 257/E23.092 |

(Continued)

FOREIGN PATENT DOCUMENTS

| | | |
|---|---|---|
| CN | 110850534 A | 2/2020 |
| TW | M339772 U | 9/2008 |
| TW | M403113 U | 5/2011 |

*Primary Examiner* — Agustin Bello
(74) *Attorney, Agent, or Firm* — Kirton McConkie; Evan R. Witt

(57) ABSTRACT

The disclosure relates to an optical transceiver and a manufacturing method thereof. The optical transceiver includes a substrate, a thermal-conductive substrate, a first metal wiring structure, a light-transceiving element and an optical fiber array. The substrate has an opening, and the thermal-conductive substrate is embedded within the opening. The first metal wiring structure is integrally formed on the substrate and the thermal-conductive substrate through an electroplating or a wire-printing process. The light-transceiving element is disposed on the thermal-conductive substrate and is electrically connected to the first metal wiring structure. The optical fiber array is arranged on the thermal-conductive substrate for communication with the light-transceiving element.

20 Claims, 7 Drawing Sheets

(56) References Cited

U.S. PATENT DOCUMENTS

| | | | | |
|---|---|---|---|---|
| 7,286,354 B2* | 10/2007 | Sugahara | ............ | H01L 23/4006 257/E23.098 |
| 7,470,069 B1* | 12/2008 | Offrein | .................... | G02B 6/43 398/139 |
| 8,101,962 B2* | 1/2012 | Chiang | ................. | H01L 33/642 257/676 |
| 8,720,063 B2* | 5/2014 | Campbell | ........... | H01L 23/4006 29/890.032 |
| 9,235,017 B1* | 1/2016 | Meadowcroft | ........ | H04B 10/40 |
| 9,641,254 B1* | 5/2017 | Shen | .................... | H04B 10/801 |
| 10,499,500 B2* | 12/2019 | Berkel | .................... | H05K 3/022 |
| 10,547,158 B1* | 1/2020 | McColloch | .......... | G02B 6/4274 |
| 2005/0213882 A1* | 9/2005 | Go | .................... | H01S 5/02216 385/37 |
| 2005/0230795 A1* | 10/2005 | Furuyama | ............ | G02B 6/4284 257/E21.514 |
| 2009/0324238 A1* | 12/2009 | Kunii | .................... | H05K 1/189 398/135 |
| 2010/0294538 A1* | 11/2010 | Chiang | ................ | C23C 18/1889 205/183 |
| 2010/0307799 A1* | 12/2010 | Chiang | .................. | H05K 3/108 174/255 |
| 2011/0101384 A1* | 5/2011 | Betsuda | ................. | H05K 3/242 257/E33.066 |
| 2012/0220152 A1* | 8/2012 | Wu | .................... | H01R 13/6581 439/350 |
| 2012/0327668 A1* | 12/2012 | Chan | .................... | G02B 6/4201 362/362 |
| 2014/0010551 A1* | 1/2014 | Kurashima | ............ | H04B 10/40 29/592.1 |
| 2014/0092576 A1* | 4/2014 | Lucero | ............... | G02B 6/12004 438/65 |
| 2014/0212099 A1* | 7/2014 | Wu | .................... | G02B 6/4206 385/93 |
| 2017/0315299 A1* | 11/2017 | Math | ........................ | G02B 6/34 |
| 2018/0035531 A1* | 2/2018 | Nalla | .................... | H05K 3/4697 |
| 2020/0142143 A1* | 5/2020 | Takai | .................... | G02B 6/4245 |
| 2020/0292769 A1* | 9/2020 | Zbinden | ................ | H04B 10/40 |
| 2021/0278614 A1* | 9/2021 | Kubo | .................... | H05K 1/0203 |

* cited by examiner

OPTICAL TRANSCEIVER AND MANUFACTURING METHOD THEREOF

FIELD OF THE INVENTION

The present disclosure relates to an optical transceiver, and more particularly to an optical transceiver and a manufacturing method thereof for improving the heat dissipation performance and ensuring the stability of signal transmission.

BACKGROUND OF THE INVENTION

An optical transceiver is a small and powerful device that is able to both transmit and receive information. In an optical fiber network, data can be transmitted in the form of light pulses. The data are transmitted at extremely high speeds and across very long distances. The optical transceiver is an important part of the optical fiber network, because electrical signals and optical signals are converted to each other by the optical transceiver. Generally speaking, the optical transceiver are plugged into or embedded in a network device to transmit and receive signals.

In a conventional optical transceiver, the optical-mechanical components of the conventional optical transceiver are completed by a multi-stage assembling process. For example, the optical-mechanical components, such as the light-transceiving element, the lens and the optical fiber array, are placed on the respective bases, and then assembled on the circuit board. However, when the optical transceiver receives and transmits the information, the different heat is generated by the respective operation of each optical-mechanical component, and the volume of each optical-mechanical component and its base is change to different degrees. Under the aforementioned changes, the positions of the optical-mechanical components are displaced, and it causes the internal optical path of the optical transceiver to shift or be interrupted, thereby reducing the stability and lifetime of the optical transceiver.

Therefore, there is a need of providing an optical transceiver and a manufacturing method thereof to overcome the above drawbacks.

SUMMARY OF THE INVENTION

An object of the present disclosure is to provide an optical transceiver and a manufacturing method thereof for improving the heat dissipation performance and ensuring the stability of signal transmission. A thermal-conductive substrate such as an aluminum nitride substrate is embedded into a circuit substrate to form an integrated structure, and the optical-mechanical components such as the light-transceiving elements are carried thereon. The integrated structure is helpful of improving the overall heat dissipation efficiency. Moreover, a metal wiring structure is integrally formed between the substrate and the thermal-conductive substrate through an electroplating or a wire-printing process. With the characteristics of high thermal conductivity of the thermal-conductive substrate and the pattern design for soldering directly, it facilitates the optical-mechanical components arranged on the thermal-conductive substrate to achieve an effective heat dissipation even under high-power driving. The heat accumulation is avoided to affect the operational performance of the optical transceiver.

Another object of the present disclosure is to provide an optical transceiver and a manufacturing method thereof for improving the heat dissipation performance and ensuring the stability of signal transmission. By embedding a thermal-conductive substrate such as an aluminum nitride substrate into a circuit substrate, an integrated structure is formed to carry the optical-mechanical components such as the light-transceiving elements. Since the elastic modulus and thermal expansion coefficient of the thermal-conductive substrate and the circuit substrate are similar, it is helpful of improving the stability of the assembling process of the optical-mechanical components and the product quality, and the stability of the operating performance of the optical-mechanical components is ensured at the same time. Moreover, it prevents the heat generated by the optical-mechanical components such as the light-transceiving elements during operation from being accumulated and resulting in abnormal signal transmission or failure.

A further object of the present disclosure is to provide an optical transceiver and a manufacturing method thereof for improving the heat dissipation performance and ensuring the stability of signal transmission. The metal wiring structure formed by an electroplating or a wire-printing process is more integrally connected between the thermal-conductive substrate and the circuit substrate, and it is advantageous of achieving the shortest distance of the electrical connection between the optical-mechanical components on the thermal-conductive substrate and the circuit substrate. Thus, the return loos and the insertion loss are reduced effectively. Moreover, the heat dissipation performance is improved and the stability of signal transmission is ensured at the same time.

According to an aspect of the present disclosure, an optical transceiver is provided. The optical transceiver includes a substrate, a thermal-conductive substrate, a first metal wiring structure, a light-transceiving element and an optical fiber array. The substrate has an opening. The thermal-conductive substrate is embedded within the opening. The first metal wiring structure is integrally formed on the substrate and the thermal-conductive substrate through an electroplating or a wire-printing process. The light-transceiving element is disposed on the thermal-conductive substrate and electrically connected to the first metal wiring structure. The optical fiber array is arranged on the thermal-conductive substrate for communication with the light-transceiving element.

In an embodiment, the optical fiber array and the first metal wiring structure are located at a first side of the substrate.

In an embodiment, the light-transceiving element and the optical fiber array are located at a first side of the substrate, and the first metal wiring structure is located at a second side of the substrate. The first side and the second side are opposite to each other.

In an embodiment, the first metal wiring structure is partially extended on a surface of the thermal-conductive substrate, and the first metal wiring structure is partially located at a surface of the substrate or partially extended into the substrate.

In an embodiment, the light-transceiving element includes an electroabsorption modulated laser, a photodetector or a transimpedance amplifier.

In an embodiment, the optical transceiver further includes a chip-on carrier, and the chip-on carrier includes a carrying surface and a mounting surface. The light-transceiving element is disposed on the carrying surface, and the mounting surface is attached to the thermal-conductive substrate.

In an embodiment, the optical transceiver further includes a second metal wiring structure, wherein the first metal wiring structure and the second metal wring structure are disposed on different sides of the thermal-conductive substrate.

In an embodiment, the optical transceiver further includes a conductive component electrically connected to the first metal wiring structure and the second metal wiring structure.

In an embodiment, the optical transceiver further includes a lens disposed on the thermal-conductive substrate and located between the light-transceiving element and the optical fiber array.

In an embodiment, the optical transceiver further includes a thermal-conductive protrusion thermally coupled to the thermal-conductive substrate.

In an embodiment, the substrate is a printed circuit board.

According to another aspect of the present disclosure, an optical transceiver is provided. The optical transceiver includes a printed circuit board, a first metal wiring structure, a light-transceiving element and an optical fiber array. The printed circuit board has a thermal-conductive substrate embedded therein. The thermal-conductive substrate has a first side and a second side opposite to each other, and the first side of the thermal-conductive substrate is exposed from the printed circuit board. The first metal wiring structure is integrally formed on the thermal-conductive substrate and the printed circuit board. The light-transceiving element is disposed on the first side and electrically connected to the first metal wiring structure. The optical fiber array is disposed on the first side for communication with the light-transceiving element.

In an embodiment, the first metal wiring structure is located at the first side or the second side.

In an embodiment, the first metal wiring structure is partially extended on a surface of the thermal-conductive substrate, and the first metal wiring structure is partially located at a surface of the printed circuit board or partially extended into the printed circuit board.

In an embodiment, the light-transceiving element includes an electroabsorption modulated laser, a photodetector or a transimpedance amplifier.

In an embodiment, the optical transceiver further includes a chip-on carrier, and the chip-on carrier includes a carrying surface and a mounting surface. The light-transceiving element is disposed on the carrying surface, and the mounting surface is attached to the thermal-conductive substrate.

In an embodiment, the optical transceiver further includes a second metal wiring structure. The first metal wiring structure and the second metal wring structure are disposed on the first side and the second side, respectively.

In an embodiment, the optical transceiver further includes a conductive component electrically connected to the first metal wiring structure and the second metal wiring structure.

In an embodiment, the optical transceiver further includes a lens disposed on the thermal-conductive substrate and located between the light-transceiving element and the optical fiber array.

In an embodiment, the optical transceiver further includes a thermal-conductive protrusion thermally coupled to the thermal-conductive substrate.

According to a further aspect of the present disclosure, a manufacturing method of an optical transceiver is provided. The manufacturing method includes the steps of providing a substrate, wherein the substrate has an opening; embedding a thermal-conductive substrate within the opening; forming a first metal wiring structure through an electroplating or a wire-printing process, wherein the first metal wiring structure is integrally disposed on the substrate and the thermal-conductive substrate; and arranging a light-transceiving element and an optical fiber array on the thermal-conductive substrate so as to form the optical transceiver, wherein the light-transceiving element is electrically connected to the first metal wiring structure, and the optical fiber array spatially corresponds to the light-transceiving element for communication with the light-transceiving element.

The above objects and advantages of the present disclosure become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only; it is not intended to be exhaustive or to be limited to the precise form disclosed.

Figure 1:
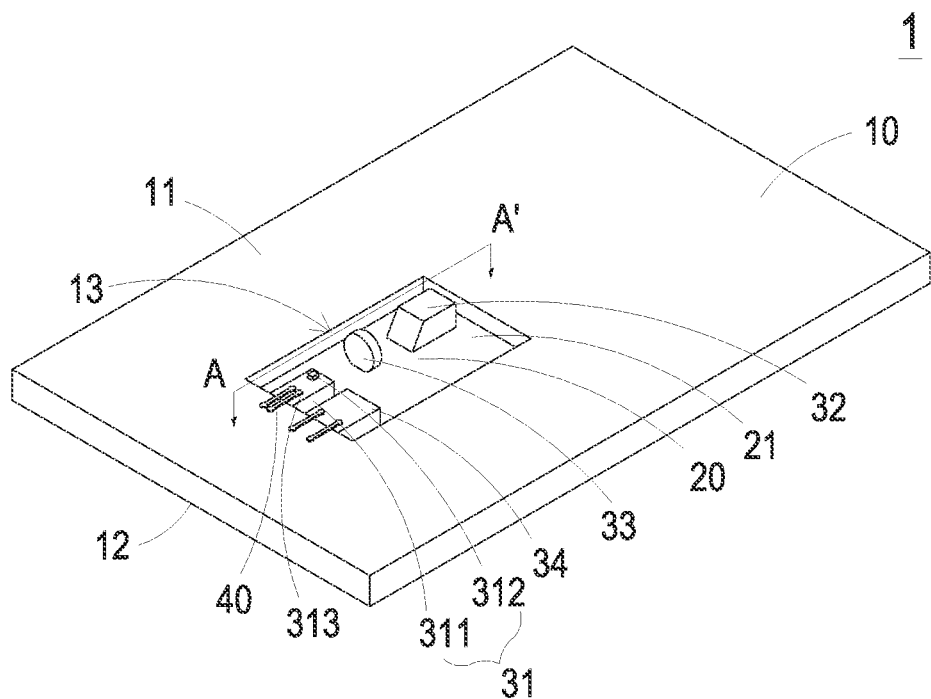
FIG. 1 shows a perspective view of an optical transceiver according to a first embodiment of the present disclosure.
Figure 2:
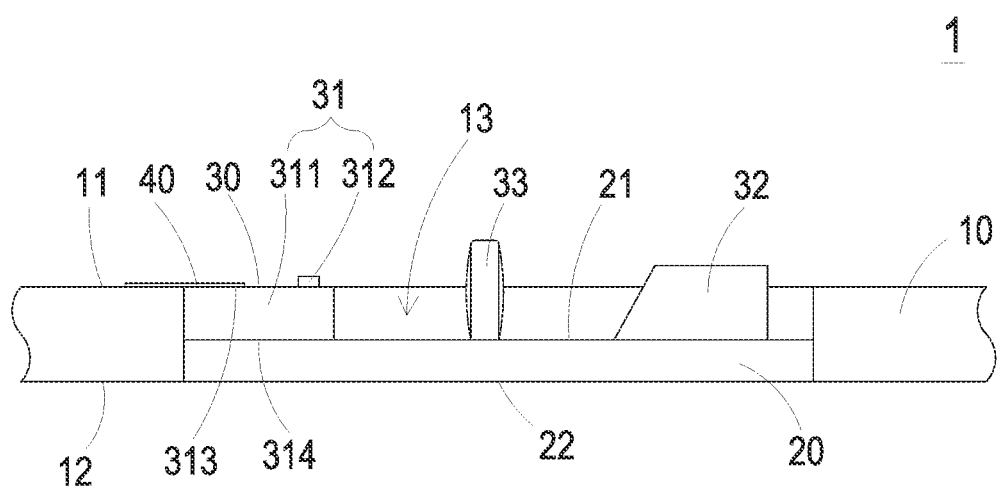
FIG. 2 is a cross-sectional view illustrating the optical transceiver and taken along the line AA' of FIG. 1.

FIG. 1 shows a perspective view of an optical transceiver according to a first embodiment of the present disclosure. FIG. 2 is a cross-sectional view illustrating the optical transceiver and taken along the line AA' of FIG. 1. In the embodiment, the optical transceiver 1 includes a substrate 10, a thermal-conductive substrate 20, a first metal wiring structure 40, a light-transceiving element 31 and an optical fiber array 32. The substrate 10 has an opening 13. Preferably but not exclusively, the substrate 10 is a printed circuit board. The thermal-conductive substrate 20 is embedded within the opening 13. The first metal wiring structure 40 is integrally formed on the substrate 10 and the thermal-conductive substrate 20 through an electroplating or a wire-printing process. The aforementioned integral formation means that the first metal wiring structure 40 is connected to the substrate 10 and the thermally-conductive substrate 20 at the same time. In an embodiment, the first metal wiring structure 40 is formed at one time. In another embodiment, the first metal wiring structure 40 is formed at multiple times. The present disclosure is not limited thereto.

In the embodiment, the light-transceiving element 31 can be for example but not limited to an electroabsorption modulated laser, a photodetector or a transimpedance amplifier. The light-transceiving element 31 is disposed on the thermal-conductive substrate 20 and electrically connected to the first metal wiring structure 40. Preferably but not exclusively, the first metal wiring structure 40 is partially extended on a surface of the thermal-conductive substrate 20, and the first metal wiring structure 40 is partially extended on a surface of the substrate 10. The optical fiber array 32 is arranged on the thermal-conductive substrate 20 for communication with the light-transceiving element 31. In an embodiment, the light-transceiving element 31 is a light-transmitting element, and the optical fiber array 32 receives a light emitted from the light-transceiving element 31. In another embodiment, the light-transceiving element 31 is a light-receiving element, and the light-transceiving element 31 receives a light emitted from the optical fiber array 32.

In the embodiment, preferably but not exclusively, the thermal-conductive substrate 20 is an aluminum nitride substrate. Preferably, the thermal conductivity of the thermal-conductive substrate 20 is greater than 160 W/m·K. Preferably, the elastic modulus (Young's modulus) of the thermal-conductive substrate 20 is about 320 GPa. Preferably, the thermal expansion coefficient of the thermal-conductive substrate 20 is about 4.4 ppm/° C. When the thermal-conductive substrate 20 meets any one of the foregoing conditions, it is helpful of improving the stability of the assembling process of the optical-mechanical components and the product quality and ensures the stability of the operating performance and lifetime of the optical-mechanical components at the same time.

In the embodiment, the substrate 10 includes a first surface 11 and a second surface 12. The first surface 11 and the second surface 12 are located at the first side and the second side of the substrate 10, respectively and opposite to each other, and the opening 13 passes through the first surface 11 and the second surface 12. On the other hands, the thermal-conductive substrate 20 includes a third surface 21 and a fourth surface 22. The third surface 21 and the fourth surface 22 are located at the first side and the second side of the thermal-conductive substrate 20, respectively, and opposite to each other. In the embodiment, the third surface 21 is disposed adjacent to the first surface 11. In the embodiment, the light-transceiving element 31 and the optical fiber array 32 are disposed on the third surface 21. The first side of the substrate 10 and the first side of the thermal-conductive substrate 20 are located at the same side, and the second side of the substrate 10 and the second side of the thermal-conductive substrate 20 are located at the same side.

In the embodiment, preferably but not exclusively, the light-transceiving element 31 is disposed adjacent to a junction of the first surface 11 of the substrate 10 and the third surface 21 of the thermal-conductive substrate 20.

Preferably but not exclusively, the light-transceiving element 31 includes an electroabsorption modulated laser (EML) 312 and a chip-on carrier (COC) 311. The chip-on carrier 311 includes a carrying surface 313 and a mounting surface 314. The electroabsorption modulated laser 312 is disposed on the carrying surface 313 of the chip-on carrier 312. The mounting surface 314 is attached to the third surface 21 of the thermal-conductive substrate 20. Preferably but not exclusively, the first surface 11 of the substrate 10 and the carrying surface 313 of the chip-on carrier 312 are connected to each other, and the first metal wiring structure 40 is disposed on the carrying surface 313 of the chip-on carrier 312 and the first surface 11 of the substrate 10. Notably, the light-transceiving element 31, the optical fiber array 32 and the first metal wiring structure 40 are disposed on the thermal-conductive substrate 20. Preferably but not exclusively, the light-transceiving element 31, the optical fiber array 32 and the first metal wiring structure 40 are located at the first side of the substrate 10 (i.e., on the first surface 11 of the substrate 10). Since the heat generated during the operation of the light-transceiving element 31 and the optical fiber array 32 is dissipated and uniformly transferred through the same thermal-conductive substrate 20, the relative positions of the light-transceiving element 31 and the optical fiber array 32 are maintained effectively. Thus, the return loos and the insertion loss are reduced effectively. It ensures that the stability of signal transmission, the heat dissipation performance, the stability of the operating performance and the lifespan of the optical transceiver 1 are improved at the same time.

In the embodiment, the optical transceiver 1 further includes a lens 33 disposed on the thermal-conductive substrate 20 and located between the light-transceiving element 31 and the optical fiber array 32 for focusing the light transmitted between the light-transceiving element 31 and the optical fiber array 32. Certainly, the present disclosure is not limited thereto. Moreover, in the embodiment, the optical transceiver 1 further includes a light-receiving component 34 disposed on the thermal-conductive substrate 20. The heat generated from the light-receiving component 34 is dissipated through the thermal-conductive substrate 20. Preferably but not exclusively, the light-receiving component 34 is an electroabsorption modulated lase, a photodetector (PD) or a transimpedance amplifier (TIA). In another embodiment, the light-receiving component 34 and the light-transceiving element 31 are disposed on two different thermal-conductive substrates 20, respectively, and assembled together within the substrate 10. Certainly, the present disclosure is not limited thereto.

Figure 3:
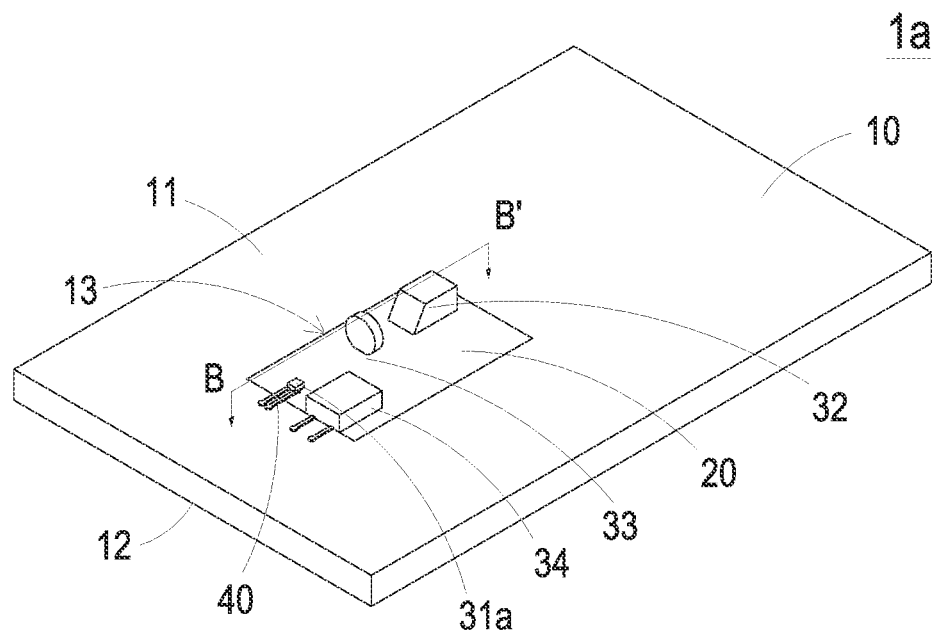
FIG. 3 shows a perspective view of an optical transceiver according to a second embodiment of the present disclosure.
Figure 4:
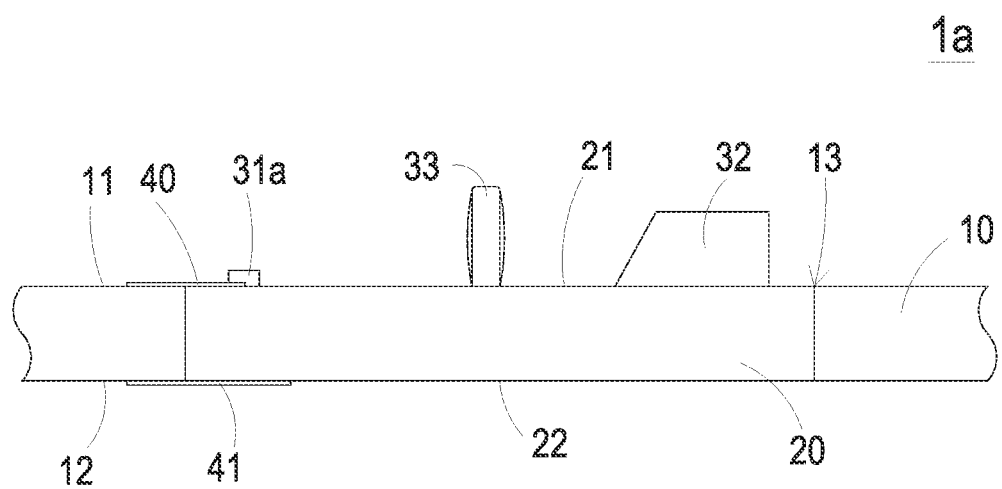
FIG. 4 is a cross-sectional view illustrating the optical transceiver and taken along the line BB' of FIG. 3.

FIG. 3 shows a perspective view of an optical transceiver according to a second embodiment of the present disclosure. FIG. 4 is a cross-sectional view illustrating the optical transceiver and taken along the line BB' of FIG. 3. In the embodiment, the structures, elements and functions of the optical transceiver 1a are similar to those of the optical transceiver 1 in FIGS. 1 to 2. The elements and features indicated by the numerals similar to those of the first embodiment mean similar elements and features, and are not redundantly described herein. In the embodiment, the optical transceiver 1a includes a substrate 10, a thermal-conductive substrate 20, a first metal wiring structure 40, a second metal wiring structure 41, a light-transceiving element 31a, an optical fiber array 32 and a lens 33. The substrate 10 includes a first surface 11, a second surface 12 and an opening 13. The thermal-conductive substrate 20 is embedded within the opening 13. The third surface 21 and the fourth surface 22 of the thermal-conductive substrate 20 are connected to the first surface 11 and the second surface 12 of the substrate 10, respectively. The first metal wiring structure 40 is integrally formed on the first surface 11 of the substrate 10 and the third surface 21 the thermal-conductive substrate 20 through an electroplating or a wire-printing process. The second metal wiring structure 41 is integrally formed on the second surface 12 of the substrate 10 and the fourth surface 22 of the thermal-conductive substrate 20 through the electroplating or the wire-printing process. That is, the first metal wiring structure 40 and the second metal wiring structure 41 are disposed on opposed sides of the thermal-conductive substrate 20. In an embodiment, the light-transceiving element 31a is an electroabsorption modulated laser chip without the chip-on carrier. Namely, the thermal-conductive substrate 20 is used as the carrier of the chip. Alternatively, the light-transceiving element 31a is directly disposed on the third surface 21 of the thermal-conductive substrate 20 by a flip chip process, and electrically connected to the first metal wiring structure 40, so that the first metal wiring structure 40 is severed as a signal transmission channel. Since the heat generated from the light-transceiving element 31a is dissipated through the thermal-conductive substrate 20 directly, the heat dissipation efficiency of the optical transceiver 1a is further enhanced. On the other hand, the second metal wiring structure 41 disposed on the second surface 12 and the fourth surface 22 are used as for example but not limited to a ground wire or a heat-dissipating metal layer. Certainly, the present disclosure is not limited thereto. In other embodiments, the light-transceiving element 31a and the optical fiber array 32 are disposed at the first side (i.e., on the first surface 11 of the substrate 10), and the first metal wiring structure 40 is disposed at the second side (i.e., on the second surface 12 of the substrate 10). The first side and the second side are opposed to each other. A part of the first metal wiring structure 40 is also used as a ground wire or a heat-dissipating metal layer. The present disclosure is not limited thereto and not redundantly described herein.

Figure 5:
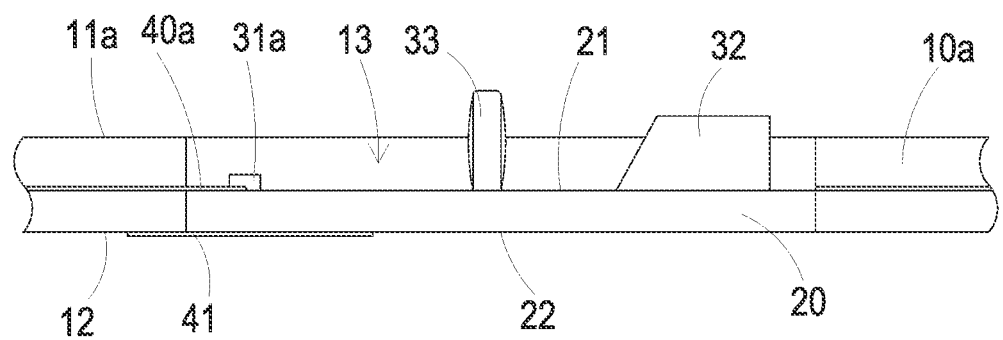
FIG. 5 is a cross-sectional view illustrating an optical transceiver according to a third embodiment of the present disclosure.

FIG. 5 is a cross-sectional view illustrating an optical transceiver according to a third embodiment of the present disclosure. In the embodiment, the structures, elements and functions of the optical transceiver 1b are similar to those of the optical transceiver 1a in FIGS. 3 to 4. The elements and features indicated by the numerals similar to those of the second embodiment mean similar elements and features, and are not redundantly described herein. In the embodiment, the substrate 10a is a printed circuit board. Preferably but not exclusively, the substrate 10a is a multilayer circuit board. The thermal-conductive substrate 20 is embedded within the opening 13 of the substrate 10a, and the fourth surface 22 of the thermal-conductive substrate 20 is connected to the second surface 12 of the substrate 10. The first metal wiring structure 40a is integrally formed on the third surface 21 of the thermal-conductive substrate 20 through an electroplating or a wire-printing process and extended between the first surface 11a and the second surface 12 of the substrate 10a. Preferably but not exclusively, the first metal wiring structure 40 is partially extended on a surface of the thermal-conductive structure 20, and the first metal wiring structure 40 is partially extended into the substrate 10. In other words, the first metal wiring structure 40a is further severed as an internal wiring structure of the substrate 10a, which is electrically connected to the first surface 11a or the second surface 12 of the substrate 10a through the conductive vias. Thereby, the heat generated from the light-transceiving element 31a is dissipated through the thermal-conductive substrate 20 directly. The heat dissipation efficiency of the optical transceiver 1b is enhanced. In addition, a multi-variable circuit connection design for the light-transceiving element 31a is achieved through the first metal wiring structure 40a. Certainly, the present disclosure is not limited thereto.

Figure 6:
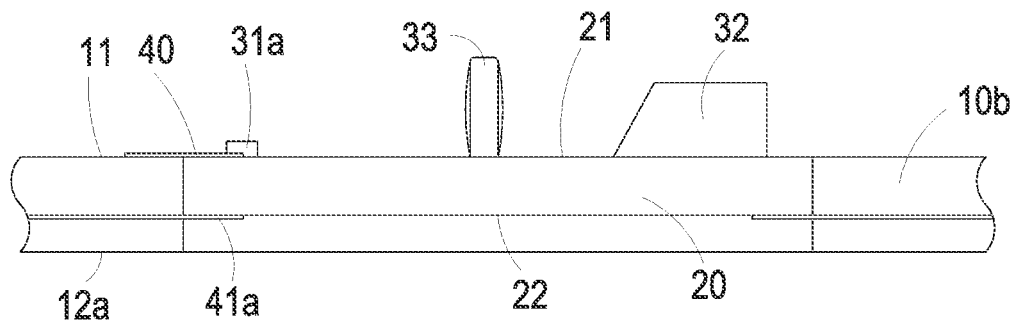
FIG. 6 is a cross-sectional view illustrating an optical transceiver according to a fourth embodiment of the present disclosure.

FIG. 6 is a cross-sectional view illustrating an optical transceiver according to a fourth embodiment of the present disclosure. In the embodiment, the structures, elements and functions of the optical transceiver 1c are similar to those of the optical transceiver 1a in FIGS. 3 to 4. The elements and features indicated by the numerals similar to those of the second embodiment mean similar elements and features, and are not redundantly described herein. In the embodiment, the second metal wiring structure 41a is integrally formed on the fourth surface 22 of the thermal-conductive substrate 20 through an electroplating or a wire-printing process and extended between the first surface 11 and the second surface 12a of the substrate 10b. In other words, the second metal wiring structure 41a is further severed as an internal wiring structure of the substrate 10b, which is electrically connected to the first surface 11 or the second surface 12a of the substrate 10b through the conductive vias. Thereby, the heat generated from the light-transceiving element 31a is dissipated through the thermal-conductive substrate 20 directly, and the heat dissipation efficiency of the optical transceiver 1c is further enhanced. In addition, the second metal wiring structure 41a on the substrate 10b is severed as for example but not limited to a ground wire or a heat-dissipating metal layer, so that a multi-variable circuit connection design is achieved and the heat dissipation efficiency of the optical transceiver 1c is enhanced. Certainly, the present disclosure is not limited thereto.

Figure 7:
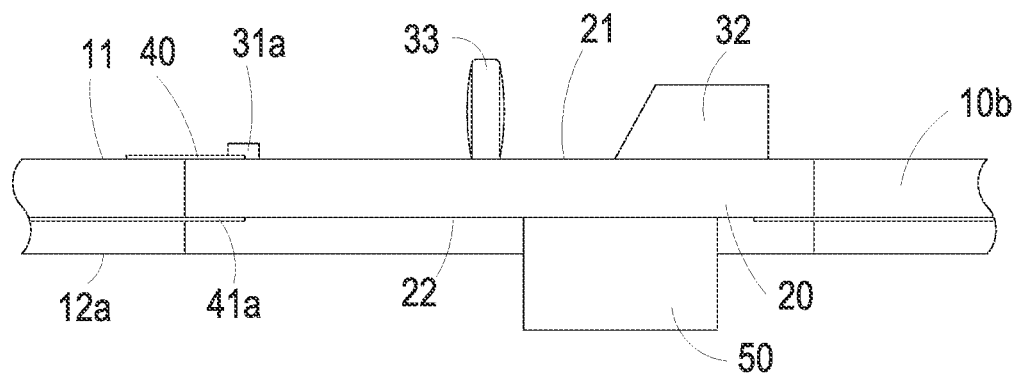
FIG. 7 is a cross-sectional view illustrating an optical transceiver according to a fifth embodiment of the present disclosure.

FIG. 7 is a cross-sectional view illustrating an optical transceiver according to a fifth embodiment of the present disclosure. In the embodiment, the structures, elements and functions of the optical transceiver 1d are similar to those of the optical transceiver 1c in FIG. 6. The elements and features indicated by the numerals similar to those of the fourth embodiment mean similar elements and features, and are not redundantly described herein. In the embodiment, the optical transceiver 1d further includes a thermal-conductive protrusion 50 thermally coupled to the fourth surface 22 of the thermal-conductive substrate 20 so as to enhance the heat dissipation efficiency of the thermal-conductive substrate 20. Preferably but not exclusively, the thermal conductive protrusion 50 is made of zinc or copper alloy.

Figure 8:
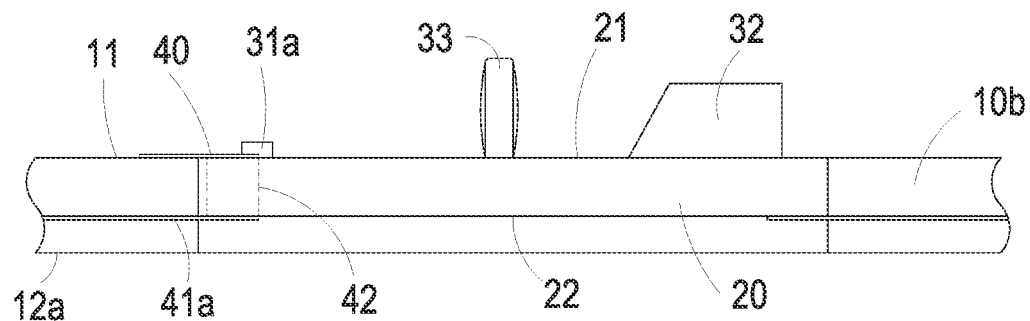
FIG. 8 is a cross-sectional view illustrating an optical transceiver according to a sixth embodiment of the present disclosure.

FIG. 8 is a cross-sectional view illustrating an optical transceiver according to a sixth embodiment of the present disclosure. In the embodiment, the structures, elements and functions of the optical transceiver 1e are similar to those of the optical transceiver 1c in FIG. 6. The elements and features indicated by the numerals similar to those of the fourth embodiment mean similar elements and features, and are not redundantly described herein. In the embodiment, the thermal-conductive substrate 20 further includes a conductive component 42 formed on a lateral wall of the thermal-conductive substrate 20 or embedded within the thermal-conductive substrate 20. The conductive component 42 is electrically connected between the first metal wiring structure 40 and the second metal wiring structure 41a. In the embodiment, preferably but not exclusively, the conductive component 42 is a sidewall metal-plating layer. In other embodiment, the conductive component 42 is a conductive via or a conductive pillar. The present disclosure is not limited thereto and not redundantly described herein.

As described above, the thermal-conductive substrate 20 such as the aluminum nitride substrate is embedded within the substrate 10, 10a, 10b to form an integrated structure to carry the optical-mechanical component such as the light-transceiving element 31, 31a. The integrated structure is helpful of improving the overall heat dissipation efficiency and maintaining a smooth optical path between the optical-mechanical components. Moreover, the first metal wiring structure 40, 40a and the second metal wiring structure 41, 41a are integrated on the substrate 10, 10a, 10b and the thermal-conductive substrate 20 through the electroplating or the wire-printing process. With the characteristics of high thermal conductivity of the thermal-conductive substrate 20 and the pattern design of the first metal wiring structure 40, 40a and the second metal wiring structure 41, 41a for soldering directly, the efficiency of heat dissipating for the optical-mechanical component arranged on the thermal-conductive substrate 20 is enhanced, and the stability of signal transmission is ensured. For the foregoing embodiments, the present disclosure further provides a manufacturing method of an optical transceiver.

Figure 9A:
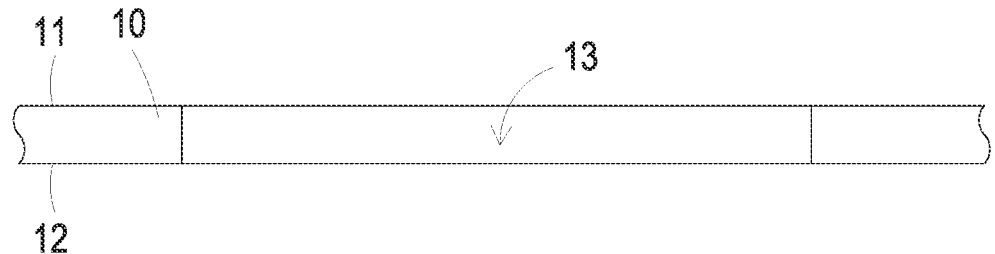
FIGS. 9A to 9D show a manufacturing method of an optical transceiver according to a first embodiment of the present disclosure.
Figure 9B:
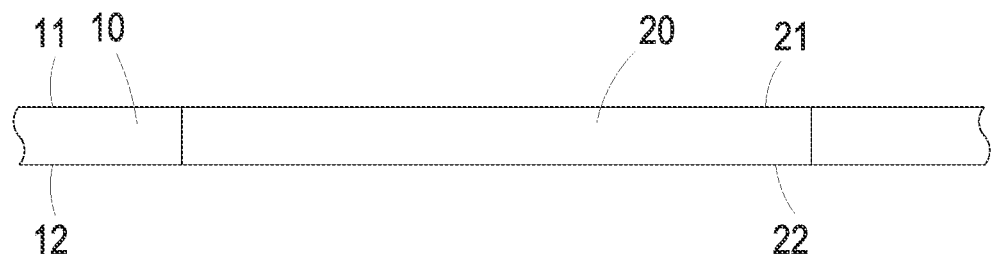
Figure 9C:
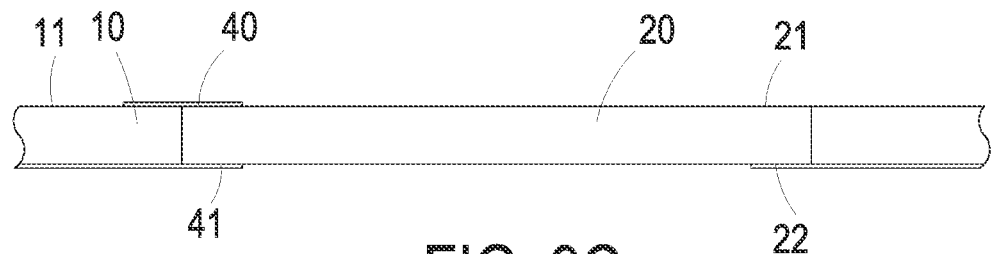
Figure 9D:
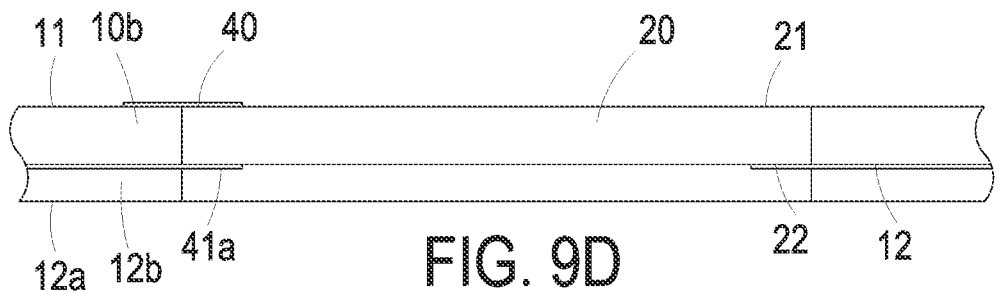
Figure 10:
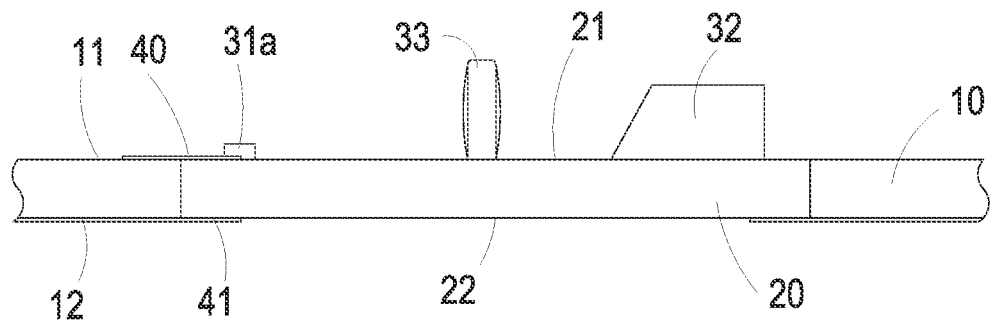
FIG. 10 is a cross-sectional view illustrating an optical transceiver according to a seventh embodiment of the present disclosure.

FIGS. 9A to 9D show a manufacturing method of an optical transceiver according to a first embodiment of the present disclosure. Firstly, as shown in FIG. 9A, a substrate 10 is provided. The substrate 10 includes a first surface 11, a second surface 12 and an opening 13. The opening 13 passes through the first surface 11 and the second surface 12. As shown in FIG. 9B, a thermal-conductive substrate 20 such as an aluminum nitride substrate is embedded within the opening 13 of the substrate 10, so that the substrate 10 and the thermal-conductive substrate 20 are collaboratively formed as an integrated structure. In the embodiment, the substrate 10 and the thermal-conductive substrate 20 have the same thickness, the first surface 11 of the substrate 10 is connected to the third surface 21 of the thermal-conductive substrate 20, and the second surface 12 of the substrate 10 is connected to the fourth surface 22 of the thermal-conductive substrate 20. Certainly, the present disclosure is not limited thereto. Any combination method of embedding the thermal-conductive substrate 20 within the substrate 10 is suitable for the present disclosure. Thereafter, as shown in FIG. 9C, a first metal wiring structure 40 or/and a second metal wiring structure 41 are formed through an electroplating or a wire-printing process. In the embodiment, preferably but not exclusively, the first metal wiring structure 40 is extended from the third surface 21 of the thermal-conductive substrate 20 to the first surface 11 of the substrate 10. Moreover, the second metal wiring structure 41 is extended from the fourth surface 22 of the thermal-conductive substrate 20 to the second surface 12 of the substrate 10. Finally, the light-transceiving element 31a, the optical fiber array 32, the lens 33 and other optical-mechanical components are arranged on the third surface 21 of the thermal-conductive substrate 20, so as to complete the coupling and alignment thereof. The optical transceiver if is obtained as shown in FIG. 10. In the embodiment, the optical fiber array 32 spatially corresponds to the light-transceiving element 31a. The lens 33 is located between the light-transceiving element 31a and the optical fiber array 32 for transmitting the light from the light-transceiving element 31 or the optical fiber array 32 therethrough.

Moreover, in the embodiment, the light-transceiving element 31a is electrically connected to the first metal wiring structure 40 and disposed adjacent to a junction of the third surface 21 of the thermal-conductive substrate 20 and the first surface 11 of the substrate 10, and it is advantageous of achieving the shortest distance of the electrical connection between the light-transceiving element 31a arranged on the thermal-conductive substrate 20 and the substrate 10. Thus, the return loos and the insertion loss are reduced effectively.

Figure 11:
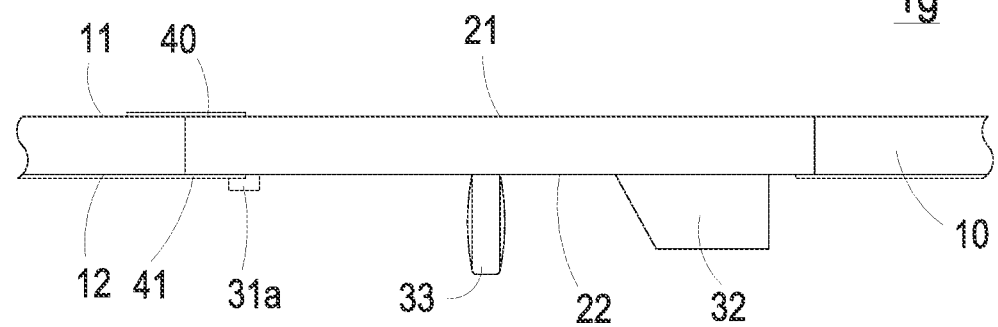
FIG. 11 is a cross-sectional view illustrating an optical transceiver according to an eighth embodiment of the present disclosure.

Moreover, the heat dissipation performance is improved and the stability of signal transmission is ensured at the same time. In another embodiment, the light-transceiving element 31a, the optical fiber array 32, the lens 33 and other optical-mechanical components are disposed on the fourth surface 21 of the thermal-conductive substrate 20, and the optical transceiver 1g is obtained, as shown in FIG. 11. In the embodiment, the first metal wiring structure 40 and the second metal wiring structure 41 are electrically connected through for example but not limited to the conductive vias or conductive pillars (not shown) of the substrate 10. Certainly, the present disclosure is not limited thereto, and not redundantly described herein.

Figure 12:
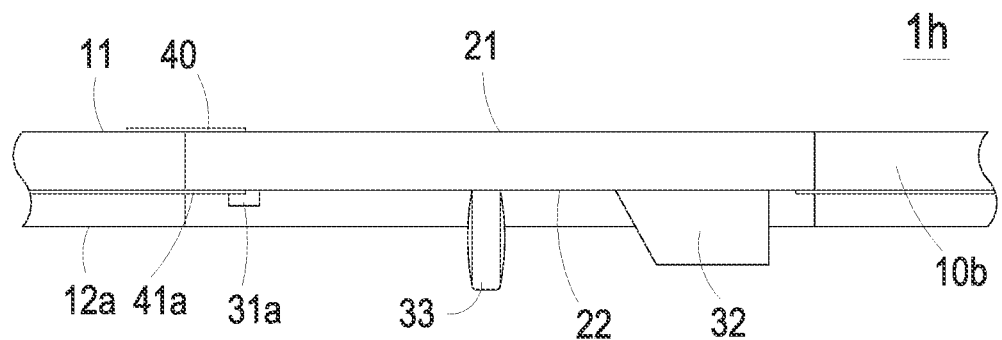
FIG. 12 is a cross-sectional view illustrating an optical transceiver according to a ninth embodiment of the present disclosure.

On the other hand, by utilizing an electroplating or a wire-printing process, the first metal wiring structure 40 is integrally formed on the third surface 21 of the thermal-conductive substrate 20 and the first surface 11 of the substrate 10, and the second metal wiring structure 41 is integrally formed on the fourth surface 22 of the thermal-conductive substrate 20 and the second surface 12 of the substrate 10. An integrated structure is obtained and shown in FIG. 9C. In an embodiment, an insulation layer 12b is covered on the second surface 12 of the substrate 10, the fourth surface 22 of the thermal-conductive substrate 20 and the second metal wiring structure 41 through for example but not limited to a lamination process. Thereafter, the fourth surface 22 of the thermal-conductive substrate 20 and a part of the second metal wiring structure 41a are exposed by etching, and the obtained structure is shown in FIG. 9D. In the embodiment, the substrate 10b is a multilayer circuit board. The second metal wiring structure 41a is further extended between the first surface 11 and the second surface 12a to form an internal wiring structure of the substrate 10b. In that, the light-transceiving element 31a, the optical fiber array 32, and the lens 33 are arranged on the third surface 21 of the thermal-conductive substrate 20, and the optical transceiver 1c is obtained, as shown in FIG. 6. In another embodiment, the light-transceiving element 31a, the optical fiber array 32 and the lens 33 are arranged on the fourth surface 21 of the thermal-conductive substrate 20, and the optical transceiver 1h is obtained as shown in FIG. 12.

Figure 13A:
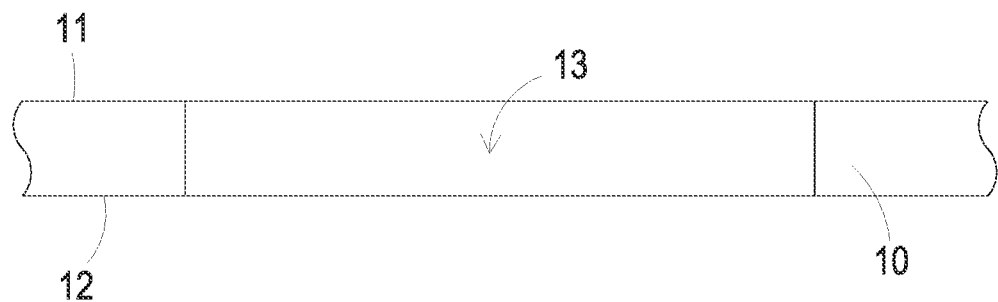
FIGS. 13A to 13C show a manufacturing method of an optical transceiver according to a second embodiment of the present disclosure.
Figure 13B:
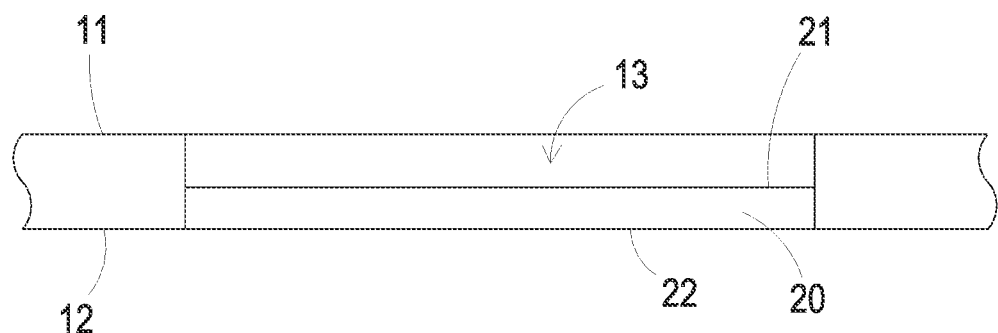
Figure 13C:
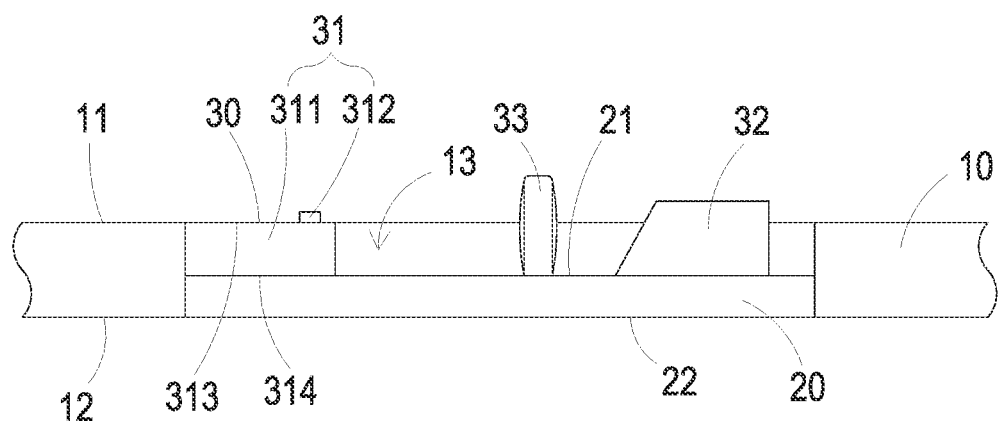

FIGS. 13A to 13C show a manufacturing method of an optical transceiver according to a second embodiment of the present disclosure. Firstly, as shown in FIG. 13A, a substrate 10 is provided. The substrate 10 includes a first surface 11, a second surface 12 and an opening 13, and the opening 13 passes through the first surface 11 and the second surface 12. Then, a thermal-conductive substrate 20 such as an aluminum nitride substrate is embedded in the opening 13 of the substrate 10, so that the substrate 10 and the thermal-conductive substrate 20 are collaboratively formed as an integrated structure, as shown in FIG. 13B. In the embodiment, preferably but not exclusively, the thickness of the substrate 10 is greater than the thickness of the thermal-conductive substrate 20. The second surface 12 of the substrate 10 is connected to the fourth surface 22 of the thermal-conductive substrate 20. The third surface 21 of the thermal-conductive substrate 20 is concavely formed from the first surface 11 of the substrate 10 and located within the opening 13 after combination. Namely, the height of the third surface 21 of the thermal-conductive substrate 20 is lower than the height of the first surface 11 of the substrate 10. Then, the light-transceiving element 31, the optical fiber array 32 and the lens 33 are arranged on the third surface 21, so as to complete the coupling and alignment thereof, as shown in FIG. 13C. In the embodiment, preferably but not exclusively, the light-transceiving element 31 includes an electroabsorption modulated laser 312 and a chip-on carrier 311. The chip-on carrier 311 includes a carrying surface 313 and a mounting surface 314. The electroabsorption modulated laser 312 is disposed on the carrying surface 313 of the chip-on carrier 311, the mounting surface 314 is attached to the third surface 21 of the thermal-conductive substrate 20, and the carrying surface 313 is connected to the first surface 11 of the substrate 10. In that, the light-transceiving element 31 is disposed adjacent to the junction of the first surface 11 of the substrate 10 and the third surface 21 of the thermal-conductive substrate 20. Thereafter, a first metal wiring structure 40 is formed by an electroplating or a wire-printing process. The first metal wiring structure 40 is disposed on the first surface 11 of the substrate 10, and extended to the carrying surface 313 of the chip-on carrier 311 on the thermal-conductive substrate 20. It is advantageous of achieving the shortest distance of the electrical connection between the electroabsorption modulated laser 312 arranged on the thermal-conductive substrate 20 and the substrate 10. The transceiver 1 is obtained, as shown in FIG. 1 and FIG. 2. Thus, the heat generated from the electroabsorption modulation laser 312 is dissipated through the chip-on carrier 311 and the thermal-conductive substrate 20 effectively. Moreover, the first metal wiring structure 40 formed by the electroplating or the wire-printing process is integrally connected between the thermal-conductive substrate 20 and the substrate 10, so that the electroabsorption modulated laser 312 is electrically connected to the substrate 10 in the shortest distance. It is helpful of improving the heat dissipation performance and ensuring the stability of signal transmission at the same time.

In summary, the present disclosure provides an optical transceiver and a manufacturing method thereof for improving the heat dissipation performance and ensuring the stability of signal transmission. Firstly, a thermal-conductive substrate such as an aluminum nitride substrate is embedded into a circuit substrate to form an integrated structure. Then, optical-mechanical components such as the light-transceiving elements are carried on the integrated structure. The integrated structure is helpful of improving the overall heat dissipation efficiency. Moreover, the metal wiring structure is integrally formed between the substrate and the thermal-conductive substrate through an electroplating or a wire-printing process. With the characteristics of high thermal conductivity of the thermal-conductive substrate and the pattern design for soldering directly, it facilitates the optical-mechanical components arranged on the thermal-conductive substrate to achieve an effective heat dissipation even under high-power driving. The heat accumulation is avoided to affect the operational performance of the optical transceiver. Moreover, the return loos and the insertion loss are reduced effectively. Thus, the heat dissipation performance is improved and the stability of signal transmission is ensured at the same time.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optical transceiver comprising:
a substrate having an opening;
a thermal-conductive substrate embedded within the opening;
a first metal wiring structure integrally formed on the substrate and the thermal-conductive substrate through an electroplating or a wire-printing process;
a light-transceiving element disposed on the thermal-conductive substrate and electrically connected to the first metal wiring structure; and
an optical fiber array arranged on the thermal-conductive substrate for communication with the light-transceiving element.

2. The optical transceiver according to claim 1, wherein the light-transceiving element, the optical fiber array and the first metal wiring structure are located at a first side of the substrate.

3. The optical transceiver according to claim 1, wherein the light-transceiving element and the optical fiber array are located at a first side of the substrate, and the first metal wiring structure is located at a second side of the substrate, wherein the first side and the second side are opposed to each other.

4. The optical transceiver according to claim 1, wherein the first metal wiring structure is partially extended on a surface of the thermal-conductive substrate, and the first metal wiring structure is partially located at a surface of the substrate or partially extended into the substrate.

5. The optical transceiver according to claim 1, wherein the light-transceiving element comprises an electroabsorption modulated laser, a photodetector or a transimpedance amplifier.

6. The optical transceiver according to claim 5, further comprising a chip-on carrier, wherein the chip-on carrier comprises a carrying surface and a mounting surface, the light-transceiving element is disposed on the carrying surface, and the mounting surface is attached to the thermal-conductive substrate.

7. The optical transceiver according to claim 1, further comprising a second metal wiring structure, wherein the first metal wiring structure and the second metal wring structure are disposed on opposed sides of the thermal-conductive substrate.

8. The optical transceiver according to claim 7, further comprising a conductive component electrically connected to the first metal wiring structure and the second metal wiring structure.

9. The optical transceiver according to claim 1, further comprising a lens disposed on the thermal-conductive substrate and located between the light-transceiving element and the optical fiber array.

10. The optical transceiver according to claim 1, further comprising a thermal-conductive protrusion thermally coupled to the thermal-conductive substrate.

11. The optical transceiver according to claim 1, wherein the substrate is a printed circuit board.

12. An optical transceiver comprising:
a printed circuit board having a thermal-conductive substrate embedded therein, wherein the thermal-conductive substrate has a first side and a second side opposed to each other, and the first side of the thermal-conductive substrate is exposed from the printed circuit board;
a first metal wiring structure integrally formed on the thermal-conductive substrate and the printed circuit board;
a light-transceiving element disposed on the first side and electrically connected to the first metal wiring structure; and an optical fiber array disposed on the first side for communication with the light-transceiving element.

13. The optical transceiver according to claim 12, wherein the first metal wiring structure is located at the first side or the second side.

14. The optical transceiver according to claim 12, wherein the first metal wiring structure is partially extended on a surface of the thermal-conductive substrate, and the first metal wiring structure is partially located at a surface of the printed circuit board or partially extended into the printed circuit board.

15. The optical transceiver according to claim 12, wherein the light-transceiving element comprises an electroabsorption modulated laser, a photodetector or a transimpedance amplifier.

16. The optical transceiver according to claim 15, further comprising a chip-on carrier, wherein the chip-on carrier comprises a carrying surface and a mounting surface, the light-transceiving element is disposed on the carrying surface, and the mounting surface is attached to the thermal-conductive substrate.

17. The optical transceiver according to claim 12, further comprising a second metal wiring structure and a conductive component, wherein the first metal wiring structure and the second metal wring structure are disposed on the first side and the second side, respectively, and the conductive component is electrically connected to the first metal wiring structure and the second metal wiring structure.

18. The optical transceiver according to claim 12, further comprising a lens disposed on the thermal-conductive substrate and located between the light-transceiving element and the optical fiber array.

19. The optical transceiver according to claim 12, further comprising a thermal-conductive protrusion thermally coupled to the thermal-conductive substrate.

20. A manufacturing method of an optical transceiver, comprising:
providing a substrate, wherein the substrate has an opening;
embedding a thermal-conductive substrate within the opening;
forming a first metal wiring structure through an electroplating or a wire-printing process, wherein the first metal wiring structure is integrally disposed on the substrate and the thermal-conductive substrate; and
arranging a light-transceiving element and an optical fiber array on the thermal-conductive substrate so as to form the optical transceiver, wherein the light-transceiving element is electrically connected to the first metal wiring structure, and the optical fiber array spatially corresponds to the light-transceiving element for communication with the light-transceiving element.

* * * * *